(12) United States Patent
Lai et al.

(10) Patent No.: US 11,862,614 B2
(45) Date of Patent: Jan. 2, 2024

(54) MICRO LED DISPLAY DEVICE AND MANUFACTURING METHOD THEREOF

(71) Applicant: PlayNitride Display Co., Ltd., Miaoli County (TW)

(72) Inventors: Yu-Hung Lai, Miaoli County (TW); Yung-Chi Chu, Miaoli County (TW); Pei-Hsin Chen, Miaoli County (TW); Yi-Ching Chen, Miaoli County (TW); Yi-Chun Shih, Miaoli County (TW)

(73) Assignee: PlayNitride Display Co., Ltd., Miaoli County (TW)

( * ) Notice: Subject to any disclaimer, the term of this patent is extended or adjusted under 35 U.S.C. 154(b) by 361 days.

(21) Appl. No.: 17/123,140

(22) Filed: Dec. 16, 2020

(65) Prior Publication Data

US 2022/0157789 A1 May 19, 2022

(30) Foreign Application Priority Data

Nov. 16, 2020 (TW) ................................. 109139989

(51) Int. Cl.
*H01L 25/075* (2006.01)
*H01L 23/00* (2006.01)
*H01L 33/54* (2010.01)
*H01L 33/62* (2010.01)
(Continued)

(52) U.S. Cl.
CPC .......... *H01L 25/0753* (2013.01); *H01L 24/81* (2013.01); *H01L 33/54* (2013.01); *H01L 33/62* (2013.01); *H01L 2224/81805* (2013.01); *H01L 2924/12041* (2013.01); *H01L 2933/005* (2013.01); *H01L 2933/0066* (2013.01)

(58) Field of Classification Search
CPC ............... H01L 25/0753; H01L 25/167; H01L 2924/12041; H01L 33/54
See application file for complete search history.

(56) References Cited

U.S. PATENT DOCUMENTS

| | | | |
|---|---|---|---|
| 2019/0012956 A1* | 1/2019 | Li | ............................ G09G 3/32 |
| 2020/0287110 A1 | 9/2020 | Oh et al. | |
| 2020/0303605 A1* | 9/2020 | Jang | ........................ H01L 33/08 |

(Continued)

FOREIGN PATENT DOCUMENTS

JP 2015002298 A 1/2015

*Primary Examiner* — Antonio B Crite
(74) *Attorney, Agent, or Firm* — CKC & Partners Co., LLC

(57) ABSTRACT

A micro LED display device includes a substrate, micro LED units and a transparent insulation layer. The substrate includes conductive pads and conductive connecting portions. The conductive pads are disposed on the substrate. Each of the micro LED units includes a semiconductor epitaxial structure and electrodes. The electrodes are disposed on the semiconductor epitaxial structure, and each of the electrodes is connected to one of the conductive connecting portions adjacent to each other. The transparent insulation layer is disposed on the substrate and covers the conductive pads, the conductive connecting portions and the micro LED units, and the transparent insulation layer is filled between the electrodes of each of the micro LED units. The transparent insulation layer relative to a surface on each of the semiconductor epitaxial structures is of a first thickness and a second thickness, and the first thickness is different from the second thickness.

6 Claims, 15 Drawing Sheets

(51) Int. Cl.
    *H01L 33/56*        (2010.01)
    *H01L 25/16*        (2023.01)

(56) References Cited

U.S. PATENT DOCUMENTS

2022/0093558 A1* 3/2022 Chen .................. H01L 24/92
2022/0139890 A1* 5/2022 Lin ..................... H01L 33/62
                                                257/79

* cited by examiner

MICRO LED DISPLAY DEVICE AND MANUFACTURING METHOD THEREOF

RELATED APPLICATIONS

This application claims priority to Taiwan Application Serial Number 109139989, filed Nov. 16, 2020, which is herein incorporated by reference.

BACKGROUND

Technical Field

The present disclosure relates to a display device and a manufacturing method thereof. More particularly, the present disclosure relates to a micro LED display device and a manufacturing method thereof.

Description of Related Art

In recent years, micro light-emitting diode (micro LED) units can be disposed on a substrate via a wire bonding process or a flip chip process to form a micro LED display device, wherein a volume of the micro LED display device can be effectively reduced via the flip chip process.

In general, a grain length of each of the micro LED units is smaller than 100 micrometers, even smaller than 50 micrometers. Hence, when the micro LED units are disposed on the substrate via the flip chip process, there is no gap between bumps of electrodes of each of the micro LED units, and as such a short circuit is easily induced. Moreover, a skew disposition is easily induced when the micro LED units are disposed on the substrate, so as causing a degradation of a display quality and the poor connection strength between each of the micro LED units and the substrate.

SUMMARY

According to one aspect of the present disclosure, a micro LED display device includes a substrate, a plurality of micro LED units and a transparent insulation layer. The substrate includes a plurality of conductive pads and a plurality of conductive connecting portions. The conductive pads are disposed on the substrate. Each of the conductive connecting portions is correspondingly connected to one of the conductive pads. Each of the micro LED units includes a semiconductor epitaxial structure and two electrodes. The electrodes are disposed on the semiconductor epitaxial structure, and each of the electrodes is connected to one of the conductive connecting portions adjacent to each other. The transparent insulation layer is disposed on the substrate and covers the conductive pads, the conductive connecting portions and the micro LED units, and the transparent insulation layer is filled between the electrodes of each of the micro LED units. The transparent insulation layer relative to a surface on each of the semiconductor epitaxial structures is of a first thickness and a second thickness, and the first thickness is different from the second thickness.

According to one aspect of the present disclosure, a micro LED display device includes a substrate, a plurality of micro LED units and a transparent insulation layer. The substrate includes a plurality of conductive pads and a plurality of conductive connecting portions. The conductive pads are disposed on the substrate. Each of the conductive connecting portions is correspondingly connected to one of the conductive pads. Each of the micro LED units includes a semiconductor epitaxial structure and two electrodes. The electrodes are disposed on the semiconductor epitaxial structure, and each of the electrodes is connected to one of the conductive connecting portions adjacent to each other. The transparent insulation layer is disposed on the substrate and covers the conductive pads, the conductive connecting portions and the micro LED units, the transparent insulation layer is filled between the electrodes of each of the micro LED units, and the transparent insulation layer includes a plurality of first transparent insulation areas and a plurality of second transparent insulation areas. The first transparent insulation areas cover the substrate. The second transparent insulation areas are connected to the first transparent insulation areas, and cover on a surface of each of the semiconductor epitaxial structures.

According to one aspect of the present disclosure, a manufacturing method of a micro LED display device includes a covering step, a disposing step, a removing step and a curing step. In the covering step, a transparent insulation layer covers a substrate. In the disposing step, a plurality of micro LED units are picked by a transposing unit, the transposing unit and the micro LED units are disposed into the transparent insulation layer, and the micro LED units are disposed on the substrate. In the removing step, the transposing unit is removed from the transparent insulation layer. In the curing step, the transparent insulation layer is cured, and the transparent insulation layer covers the micro LED units to form the micro LED display device.

DETAILED DESCRIPTION

Figure 1:
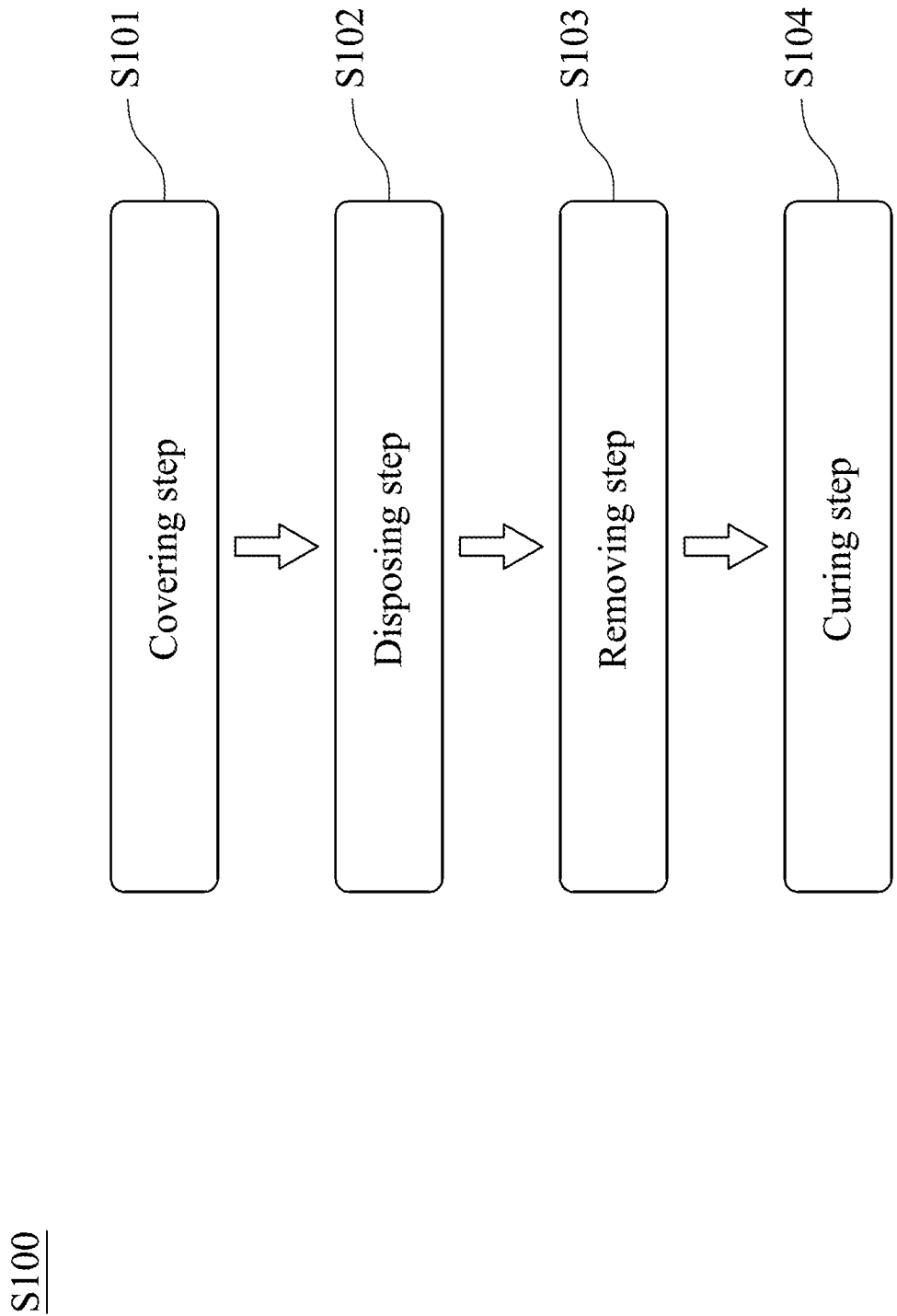
FIG. 1 is a step flow chart of a manufacturing method of a micro LED display device according to an embodiment of the present disclosure.

FIG. 1 is a step flow chart of a manufacturing method of a micro LED display device S100 according to an embodiment of the present disclosure. In FIG. 1, the manufacturing method of the micro LED display device S100 includes a covering step S101, a disposing step S102, a removing step S103 and a curing step S104.

Figure 2:
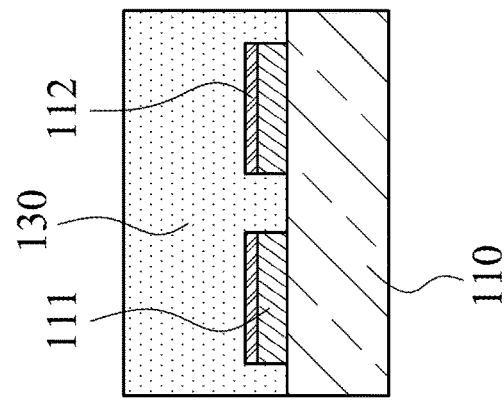
FIG. 2 is a schematic view of the covering step according to the embodiment in FIG. 1.

FIG. 2 is a schematic view of the covering step S101 according to the embodiment in FIG. 1. According to FIGS. 1 and 2, in the covering step S101, a plurality of conductive pads 111 are disposed on the substrate 110, each of conductive connecting portions 112 is disposed on the each of the conductive pads 111, and a transparent insulation layer 130 covers the substrate 110.

Figure 3:
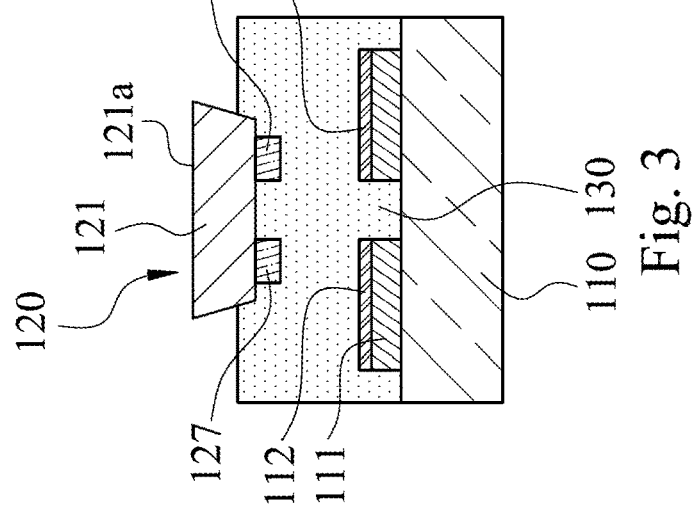
FIG. 3 is a schematic view of the disposing step according to the embodiment in FIG. 1.

FIG. 3 is a schematic view of the disposing step S102 according to the embodiment in FIG. 1. Further, according to FIGS. 1 and 3, in the disposing step S102, a plurality of micro LED units 120 are picked by a transposing unit (not shown), the transposing unit and the micro LED units 120 are disposed into the transparent insulation layer 130, and the micro LED units 120 are disposed on the substrate 110. In particular, the transparent insulation layer 130 is in a flow state in both of the covering step S101 and the disposing step S102, wherein the processing temperature of the disposing step S102 is between the glass transition temperature of the transparent insulation layer 130 and the curing temperature of the transparent insulation layer 130. Therefore, the micro LED units 120 can be smoothly disposed into the transparent insulation layer 130 and electrically connected to the substrate 110. According to the embodiment of FIG. 1, it should be mentioned that the micro LED units 120 are disposed on and electrically connected with the substrate 110 via the eutectic die bonding of the flip chip process, but the present disclosure is not limited thereto. In detail, the micro LED units 120 are pressed into the transparent insulation layer 130 in the disposing step S102, and electrodes of the micro LED units 120 contact with the conductive pads 111 of the substrate 110.

Figure 4:
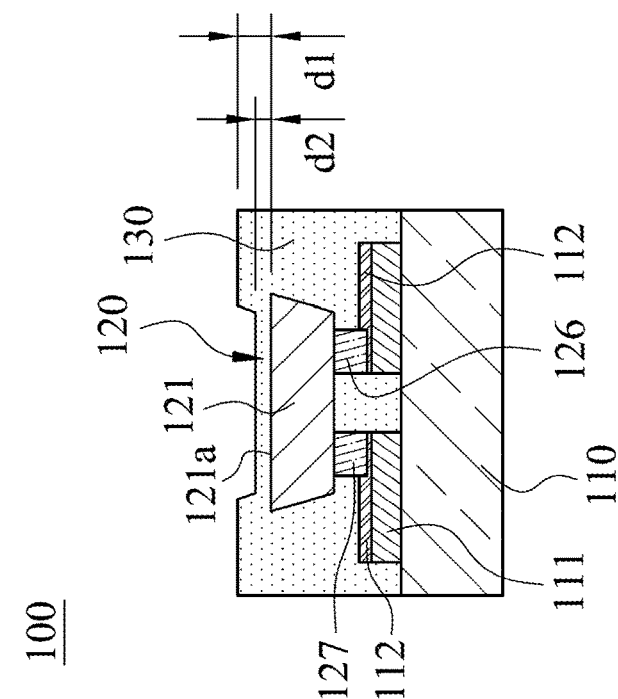
FIG. 4 is a schematic view of the removing step and the curing step according to the embodiment in FIG. 1.

FIG. 4 is a schematic view of the removing step S103 and the curing step S104 according to the embodiment in FIG. 1. Further, in FIGS. 1 and 4, the transposing unit is removed from the transparent insulation layer 130 in the removing step S103, the transparent insulation layer 130 is cured in the curing step S104, and the transparent insulation layer 130 covers the micro LED units 120 to form the micro LED display device 100. In detail, a time interval from the disposing step S102 to the curing step S104 is 10 seconds to 60 seconds. Therefore, the micro LED units 120 are fixed on the substrate 110 by forming the eutectic die bonding, and the luminous brightness of the micro LED units 120 and the display are controlled by the electrical signal of the substrate 110.

In particular, a required heating time for curing the transparent insulation layer 130 is longer than a required heating time for soldering by the conductive connecting portions 112. Hence, in the disposing step S102, when the micro LED units 120 are connected to the conductive pads 111, the transparent insulation layer 130 is not entirely cured, and the micro LED units 120 can be smoothly and electrically connected to the conductive pads 111 of the substrate 110. According to the embodiment of FIG. 1, the required heating time for curing the transparent insulation layer 130 is about 10 minutes to 120 minutes.

Moreover, when the micro LED units 120 are disposed into the transparent insulation layer 130, the transparent insulation layer 130 is in the flow state in the disposing step S102, hence the micro LED units 120 can be disposed into the transparent insulation layer 130, and the transparent insulation layer 130 is located between the conductive connecting portions 112 of the substrate 110 during the disposition of the micro LED units 120 by heating and pressing. A gap between the conductive connecting portions 112 is filled by the transparent insulation layer 130 so as to avoid the short circuit between the conductive connecting portions 112. Further, the liquid damping effect can be obtained by the transparent insulation layer 130 in the flow state, which is favorable for fixing the location of the micro LED units 120. Therefore, the skew disposition of the micro LED units 120 on the substrate 110 can be further avoided so as to promote the connection strength and the precision between the micro LED units 120 and the substrate 110 and increase the luminous efficiency.

Figure 5:
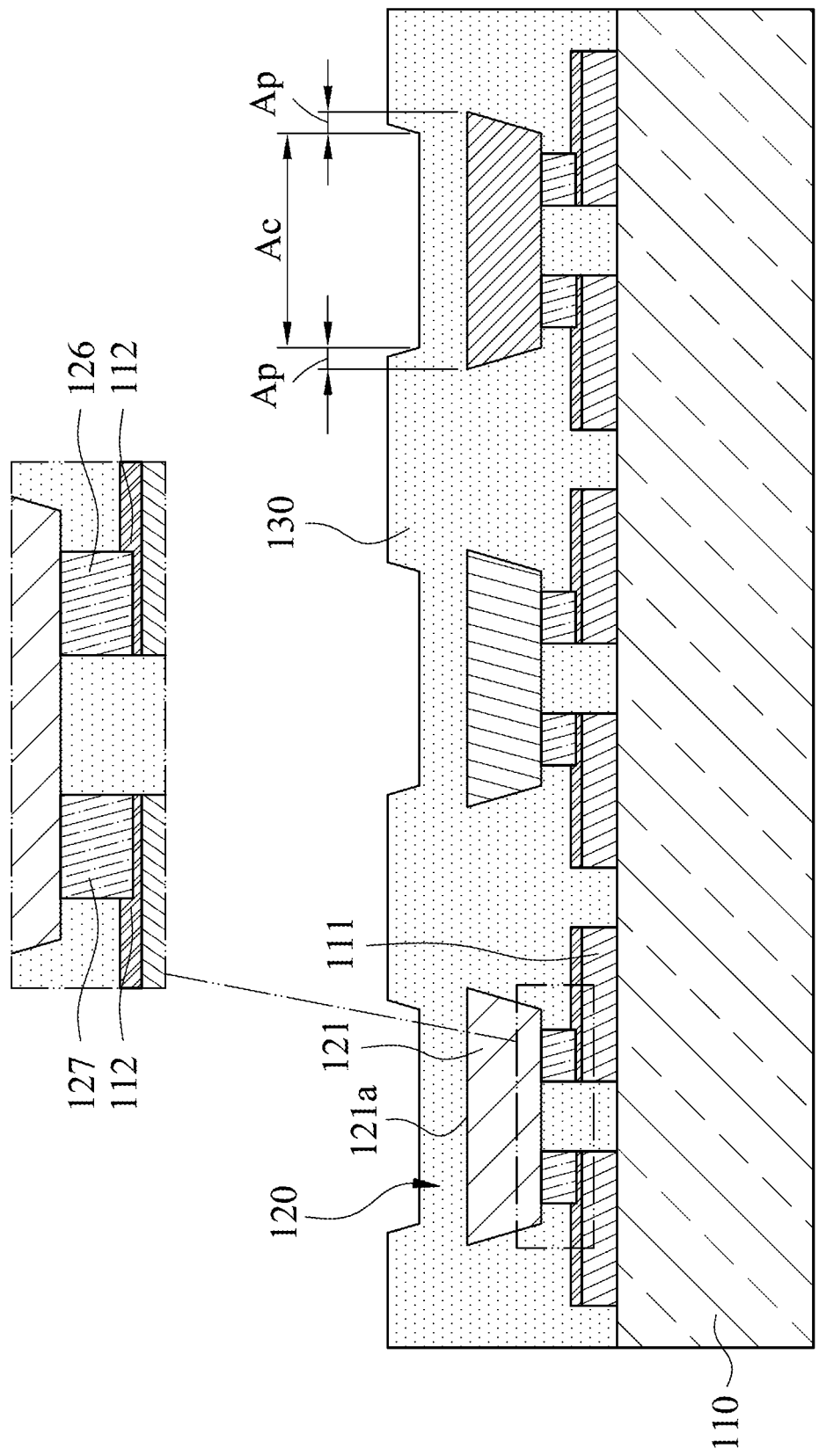
FIG. 5 is a schematic view of the micro LED display device according to the embodiment in FIG. 1.

FIG. 5 is a schematic view of the micro LED display device 100 according to the embodiment in FIG. 1. In FIG. 5, the micro LED display device 100 includes the substrate 110, the micro LED units 120 and the transparent insulation layer 130. The substrate 110 includes the conductive pads 111 and the conductive connecting portions 112, wherein the conductive pads 111 are disposed on the substrate 110, and each of the conductive connecting portions 112 is correspondingly connected to one of the conductive pads 111. Each of the micro LED units 120 includes a semiconductor epitaxial structure 121 and two electrodes (that is, a first electrode 126 and a second electrode 127), and each of the electrodes is disposed on the semiconductor epitaxial structure 121 and connected to one of the conductive connecting portions 112 which are adjacent to each other. The transparent insulation layer 130 is disposed on the substrate 110 and covers the conductive pads 111, the conductive connecting portions 112 and the micro LED units 120, and the transparent insulation layer 130 is filled between the electrodes (that is, the first electrode 126 and the second electrode 127) of each of the micro LED units 120. In other words, a top of each of the micro LED units 120 is not exposed, and the top of each of the micro LED units 120 is entirely filled with the transparent insulation layer 130. In general, a refractivity of a material of the transparent insulation layer 130 is higher than a refractivity of each of the micro LED units 120. Hence, when a light-emitting surface of the top of each of the micro LED units 120 is covered by the transparent insulation layer 130, the total reflection can be efficiently avoided to promote the display quality.

In FIG. 4, the transparent insulation layer 130 relative to a surface 121a on each of the semiconductor epitaxial structures 121 is of a first thickness d1 and a second thickness d2, and the first thickness d1 is different from the second thickness d2. Furthermore, according to the embodiment of FIG. 5, the transparent insulation layer 130 relative to the surface 121a on each of the semiconductor epitaxial structures 121 is separated into a peripheral area Ap and a covering area Ac, wherein the peripheral area Ap is of the first thickness d1, and the covering area Ac is of the second thickness d2. The first thickness d1 is larger than the second thickness d2, and the peripheral area Ap covers a portion of the surface 121a on each of semiconductor epitaxial structures 121. That is, in the disposing step S102, the micro LED units 120 are disposed into the transparent insulation layer 130 before the removing step S103 and the curing step S104, so as a portion of the transparent insulation layer 130 corresponding to each of the micro LED units 120 being concave.

In particular, the transparent insulation layer 130 can include a thermosetting resin material. A thickness range of the transparent insulation layer 130 is 10 micrometers to 50 micrometers, further can be 10 micrometers to 20 micrometers. It should be mentioned that the thickness range of the transparent insulation layer 130 is a maximal thickness from the transparent insulation layer 130 to the substrate 110. Therefore, the transmittance of the transparent insulation layer 130 can be maintained at least 80% in the aforementioned thickness range. Each of the conductive connecting portions 112 can include a metal material or an anisotropic conductive adhesive material, wherein the metal material can be a gold material, a tin-lead material, an indium material or a combination of the aforementioned materials, but the material of each of the conductive connecting portions 112 is not limited thereto.

Figure 6:
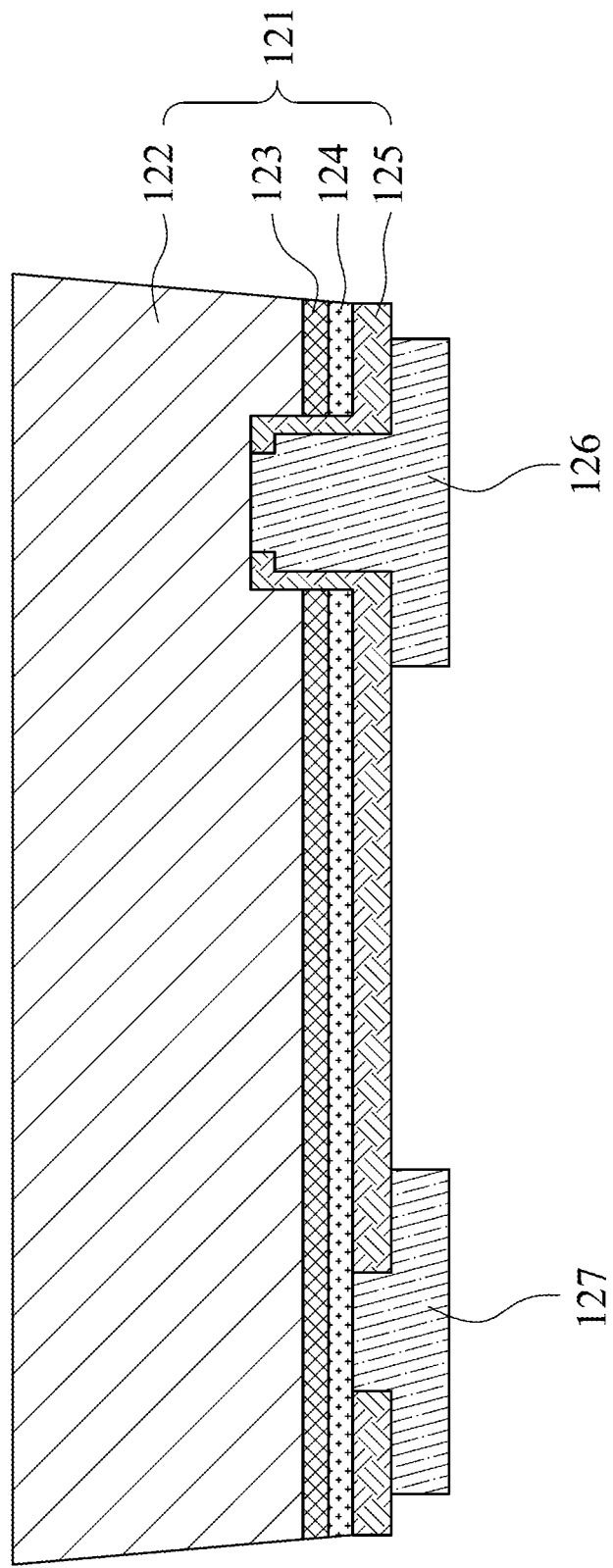
FIG. 6 is a schematic view of the micro LED unit according to the embodiment in FIG. 1.

FIG. 6 is a schematic view of the micro LED unit 120 according to the embodiment in FIG. 1. In FIGS. 5 and 6, each of the micro LED units 120 includes the semiconductor epitaxial structure 121, the first electrode 126 and the second electrode 127, wherein the semiconductor epitaxial structure 121 can include a first semiconductor 122, a light-emitting layer 123, a second semiconductor 124 and an insulation layer 125, but the micro LED unit 120 is not limited to the embodiment of FIG. 6. According to the embodiment of FIG. 6, each of the first electrode 126 and the second electrode 127 of the micro LED unit 120 has a bonding surface, and the bonding surface of the first electrode 126 and the bonding surface of the second electrode 127 are substantially coplanar. In other words, the micro LED display device 100 of the present disclosure can be applied to the embodiment of the flip chip or the embodiment of the traditional lateral chip, but the present disclosure is not limited thereto.

Figure 7:
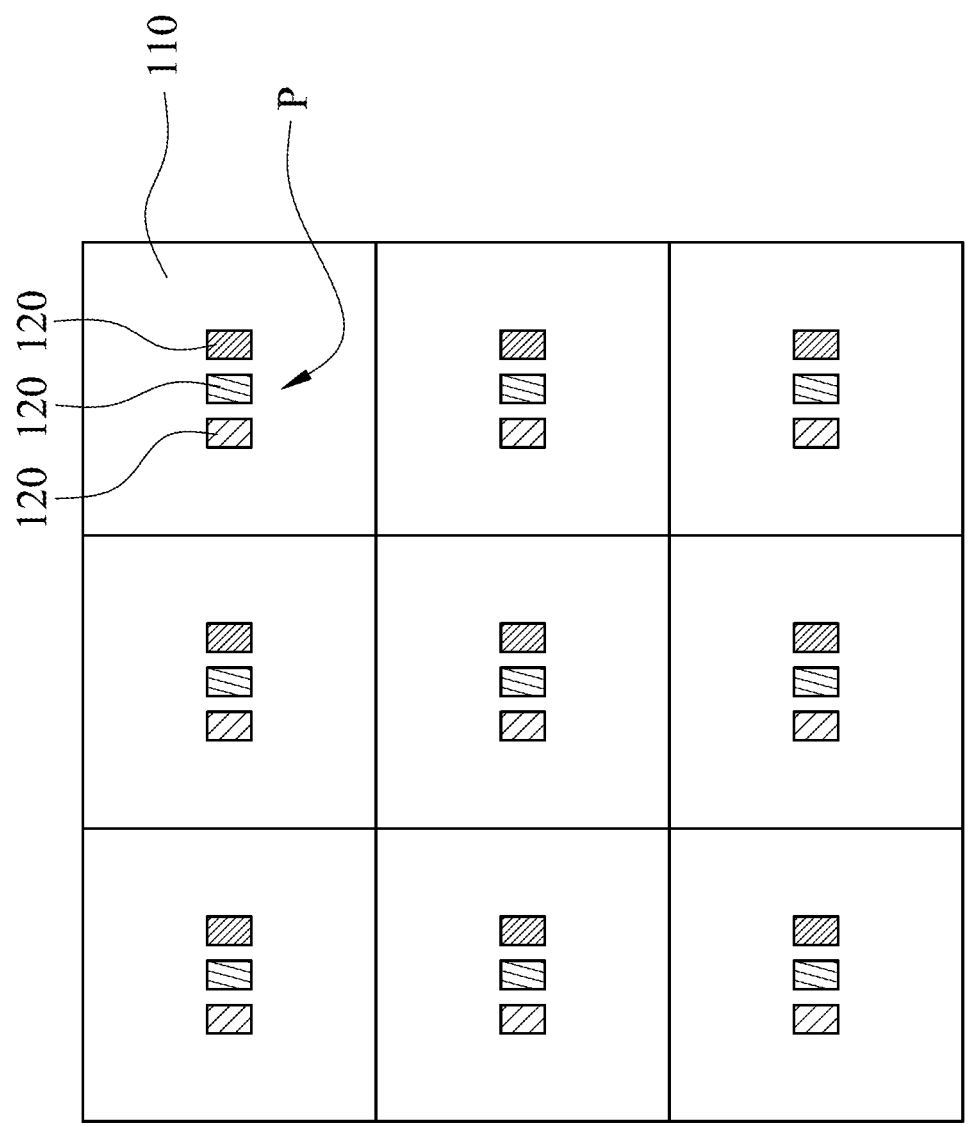
FIG. 7 is a disposing schematic view of the micro LED display device according to the embodiment in FIG. 1.
Figure 8:
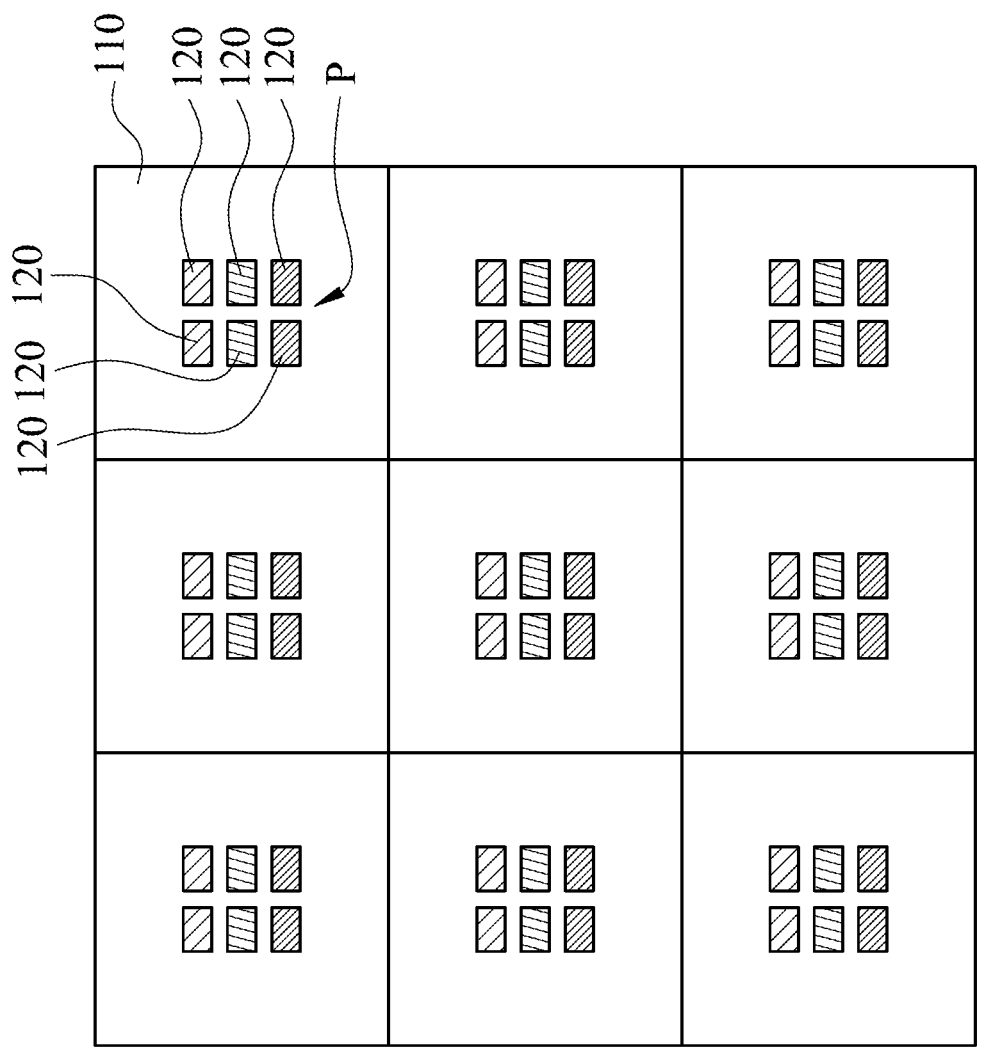
FIG. 8 is another disposing schematic view of the micro LED display device according to the embodiment in FIG. 1.

FIG. 7 is a disposing schematic view of the micro LED display device 100 according to the embodiment in FIG. 1. FIG. 8 is another disposing schematic view of the micro LED display device 100 according to the embodiment in FIG. 1. In FIGS. 7 and 8, the micro LED units 120 can be disposed on the substrate 110 by two disposing forms. In particular, according to the embodiment of FIG. 7, three of the micro LED units 120 are disposed on one pixel area P, and each of the micro LED units 120 is separated into a red sub-pixel, a green sub-pixel and a blue sub-pixel; according to the embodiment of FIG. 8, six of the micro LED units 120 are disposed on one pixel area P, on which a number of the micro LED units 120 with the same color is two, that is, each color of the sub-pixels includes one micro LED unit 120 for reserve, but the present disclosure is not limited to the disposition as described herein.

Figure 9:
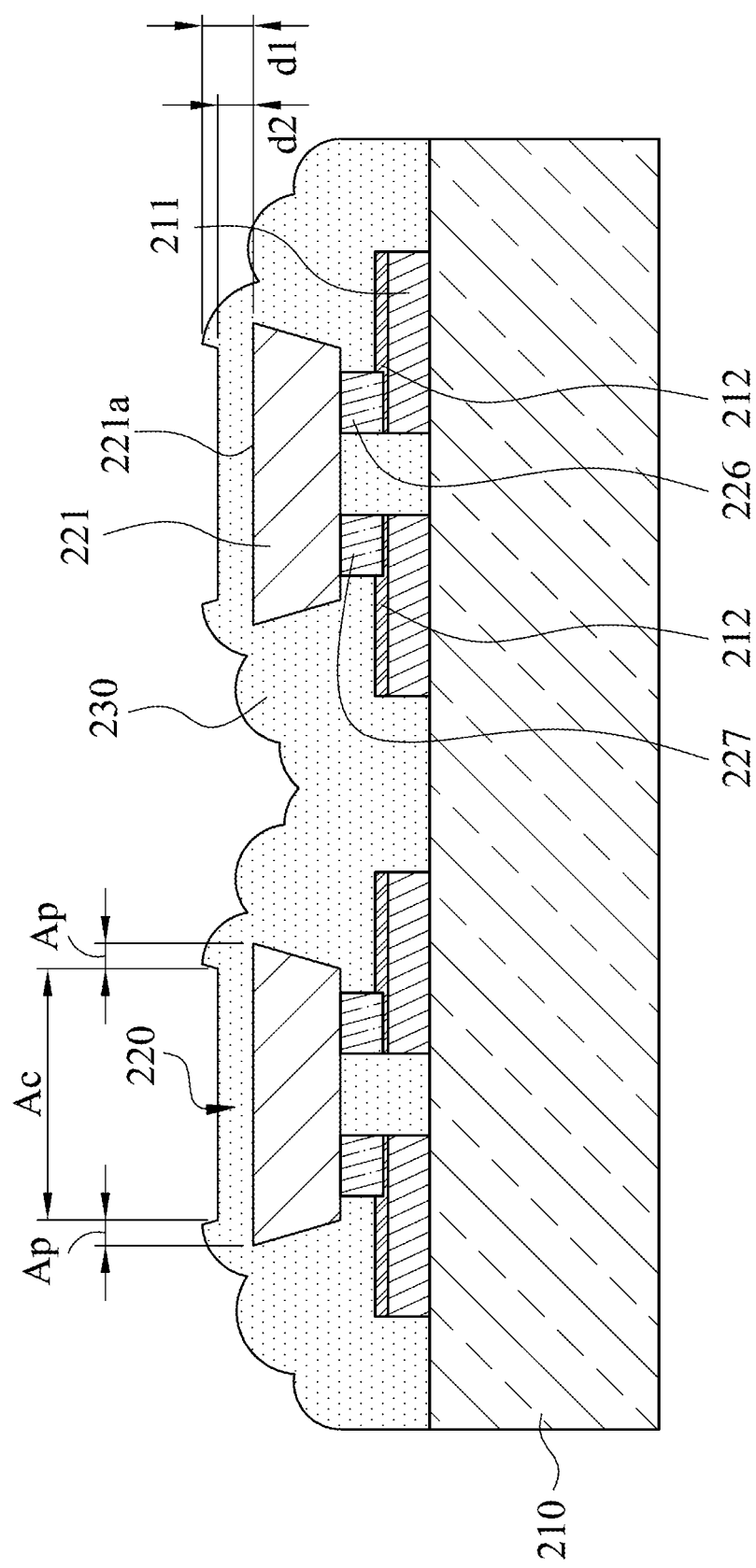
FIG. 9 is a schematic view of a micro LED display device according to another embodiment of the present disclosure.

FIG. 9 is a schematic view of a micro LED display device 200 according to another embodiment of the present disclosure. In FIG. 9, the micro LED display device 200 includes a substrate 210, a plurality of micro LED units 220 and a transparent insulation layer 230. The substrate 210 includes a plurality of conductive pads 211 and a plurality of conductive connecting portions 212, wherein the conductive pads 211 are disposed on the substrate 210, and each of the conductive connecting portions 212 is correspondingly connected to one of the conductive pads 211. Each of the micro LED units 220 includes a semiconductor epitaxial structure 221 and two electrodes 226, 227, wherein the electrodes 226, 227 are disposed on the semiconductor epitaxial structure 221, and each of the electrodes 226, 227 is connected to one of the conductive connecting portions 212 which are adjacent to each other. The transparent insulation layer 230 is disposed on the substrate 210 and covers the conductive pads 211, the conductive connecting portions 212 and the micro LED units 220, and the transparent insulation layer 230 is filled between the electrodes 226, 227 of each of the micro LED units 220.

The transparent insulation layer 230 relative to a surface 221a on each of the semiconductor epitaxial structures 221 is of a first thickness d1 and a second thickness d2, and the first thickness d1 is different from the second thickness d2. Furthermore, the transparent insulation layer 230 relative to the surface 221a on each of the semiconductor epitaxial structures 221 is separated into a peripheral area Ap and a covering area Ac, wherein the peripheral area Ap is of the first thickness d1, and the covering area Ac is of the second thickness d2. The first thickness d1 is larger than the second thickness d2, and the peripheral area Ap covers a portion of the surface 221a on each of semiconductor epitaxial structures 221. In other words, a portion of the transparent insulation layer 230 corresponding to each of the micro LED units 220 is concave, and a surface of the transparent insulation layer 230 is uneven by a curing step of a manufacturing method of the micro LED display device. The uneven surface of the transparent insulation layer 230 may be regarded as a roughened surface structure of each of the micro LED units 220, so as to broaden an effective light-emitting surface of each of the micro LED units 220. Therefore, the luminous efficiency of the micro LED display device 200 can be promoted.

Further, all of other structures and dispositions according to the embodiment of FIG. 9 are the same as the structures and the dispositions according to the embodiment of FIG. 5, and will not be described again herein.

Figure 10:
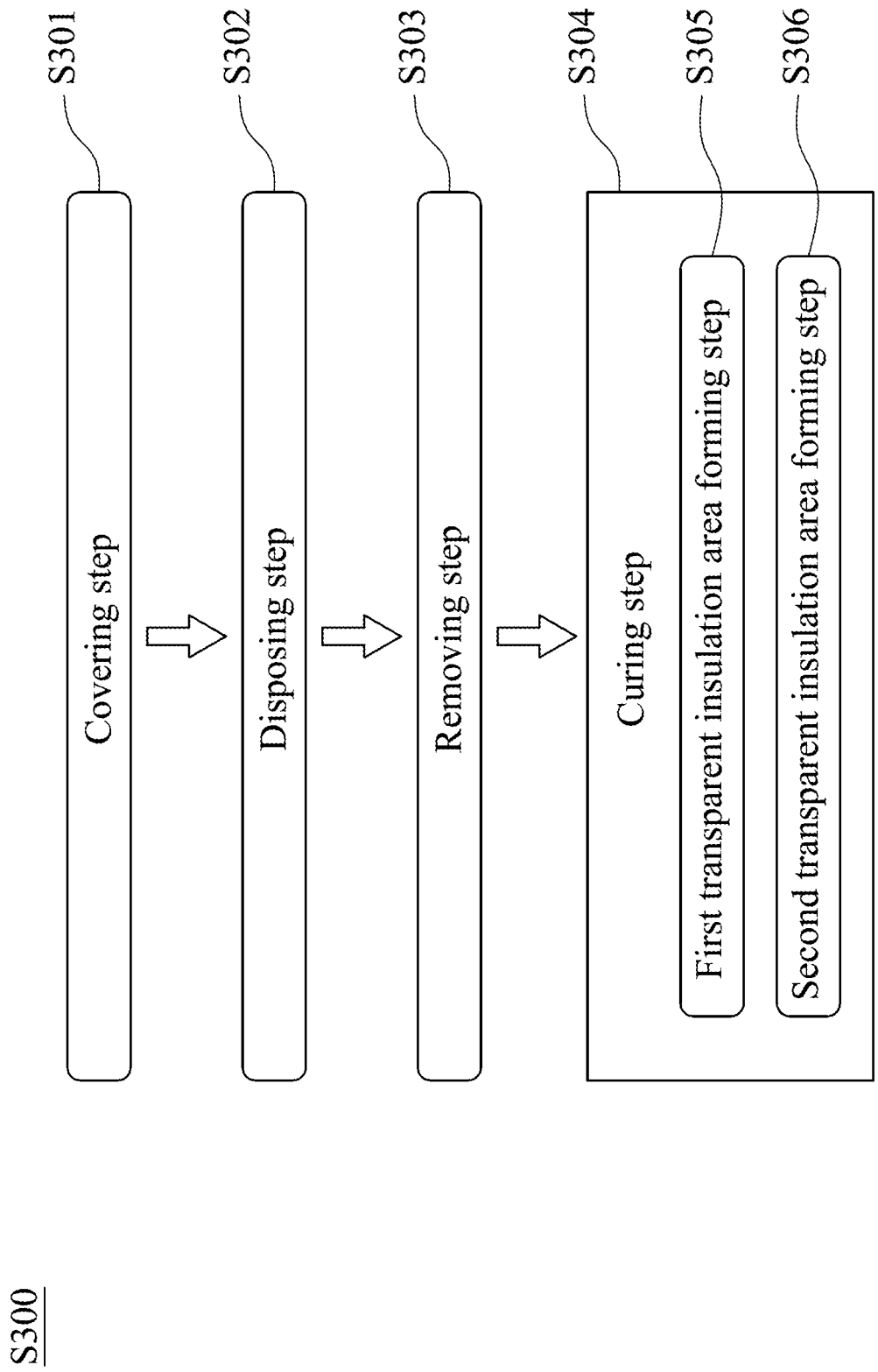
FIG. 10 is a step flow chart of a manufacturing method of a micro LED display device according to still another embodiment of the present disclosure.

FIG. 10 is a step flow chart of a manufacturing method of a micro LED display device S300 according to still another embodiment of the present disclosure. In FIG. 10, the manufacturing method of the micro LED display device S300 includes a covering step S301, a disposing step S302, a removing step S303 and a curing step S304.

Figure 11:
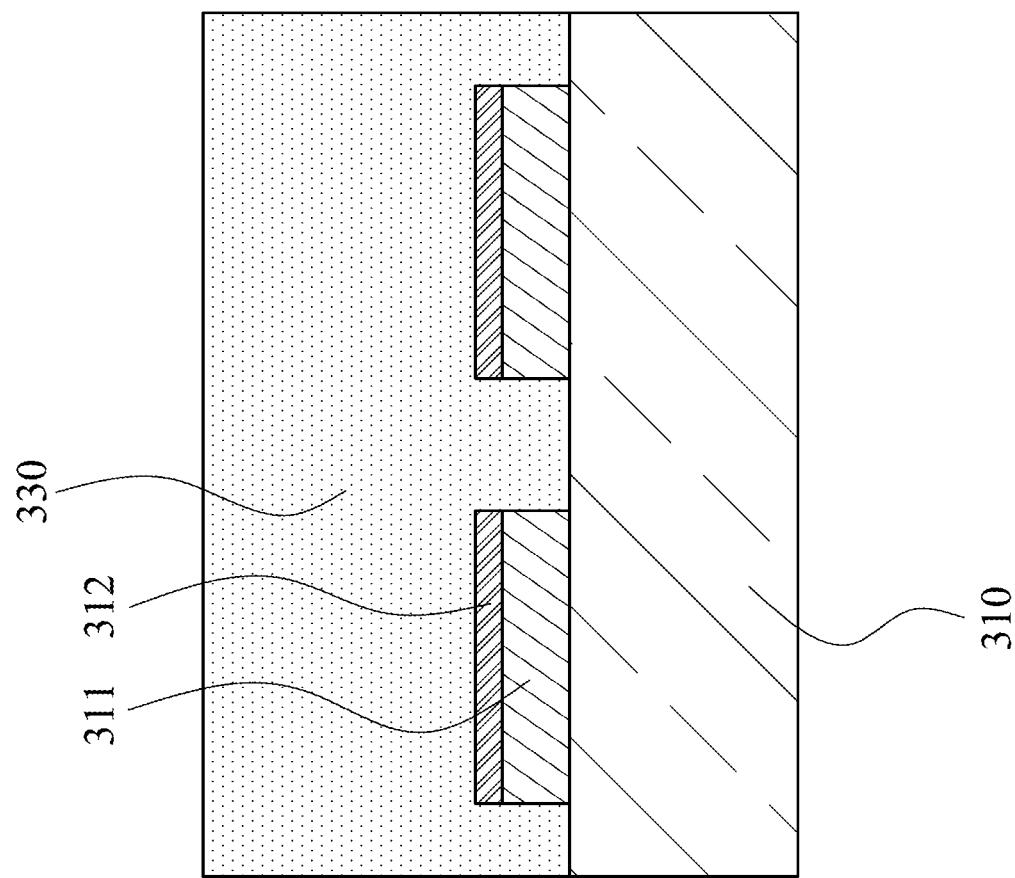
FIG. 11 is a schematic view of the covering step according to the embodiment in FIG. 10.

FIG. 11 is a schematic view of the covering step S301 according to the embodiment in FIG. 10. According to FIGS. 10 and 11, in the covering step S301, a plurality of conductive pads 311 are disposed on the substrate 310, each of conductive connecting portions 312 is disposed on the each of the conductive pads 311, and a transparent insulation layer 330 covers the substrate 310.

Figure 12:
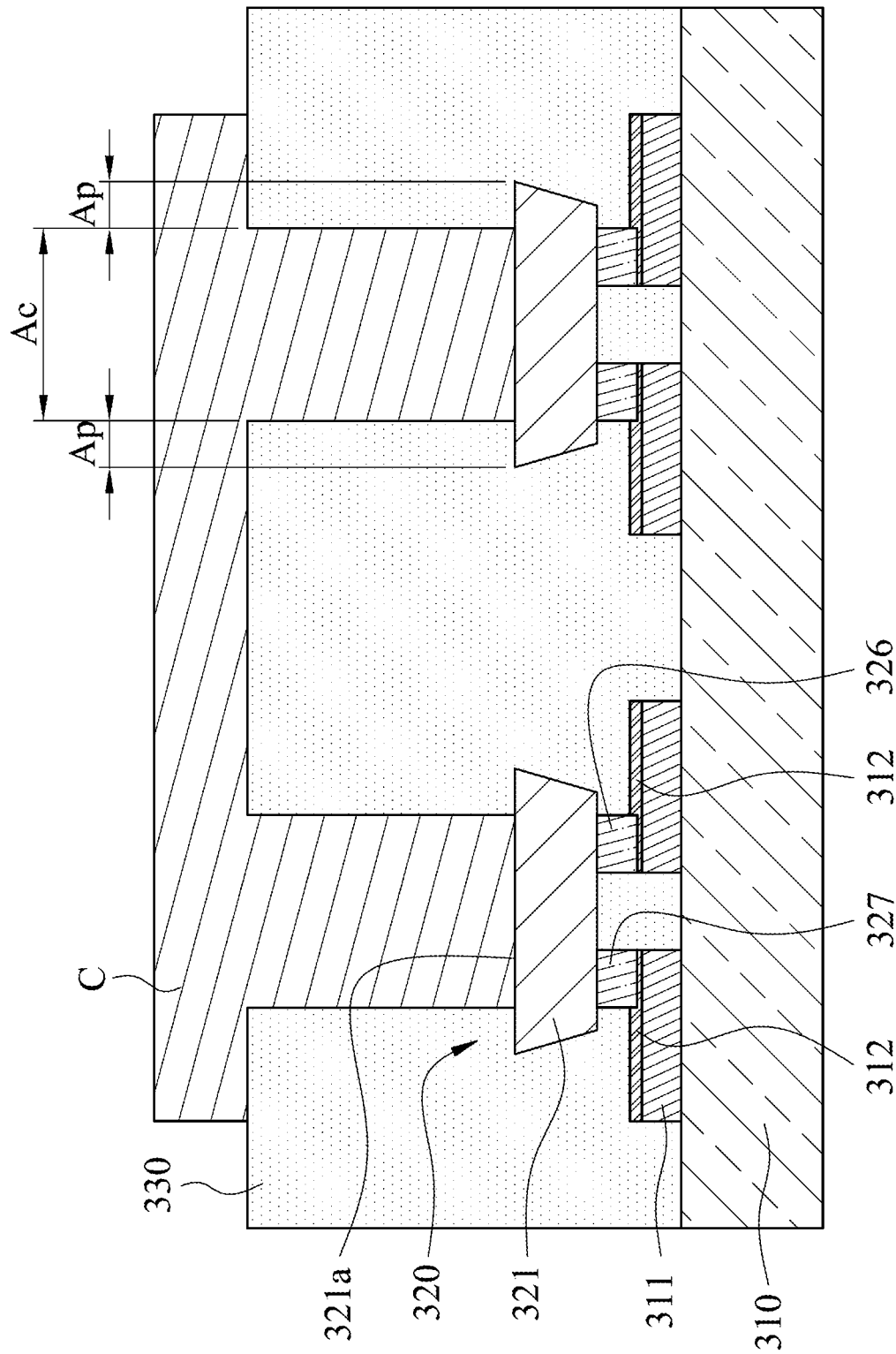
FIG. 12 is a schematic view of the disposing step according to the embodiment in FIG. 10.

FIG. 12 is a schematic view of the disposing step S302 according to the embodiment in FIG. 10. Further, according to FIGS. 10 and 12, in the disposing step S302, a plurality of micro LED units 320 are picked by a transposing unit C, the transposing unit C and the micro LED units 320 are disposed into the transparent insulation layer 330, and the micro LED units 320 are disposed on the substrate 310. In particular, the transparent insulation layer 330 is in a flow state in both of the covering step S301 and the disposing step S302, wherein the processing temperature of the disposing step S302 is between the glass transition temperature of the transparent insulation layer 330 and the curing temperature of the transparent insulation layer 330. Therefore, the micro LED units 320 can be smoothly disposed into the transparent insulation layer 330 and electrically connected to the substrate 310. According to the embodiment of FIG. 12, the micro LED units 320 are disposed on and electrically connected with the substrate 310 via the eutectic die bonding of the flip chip process, but the present disclosure is not limited thereto.

Figure 13A:
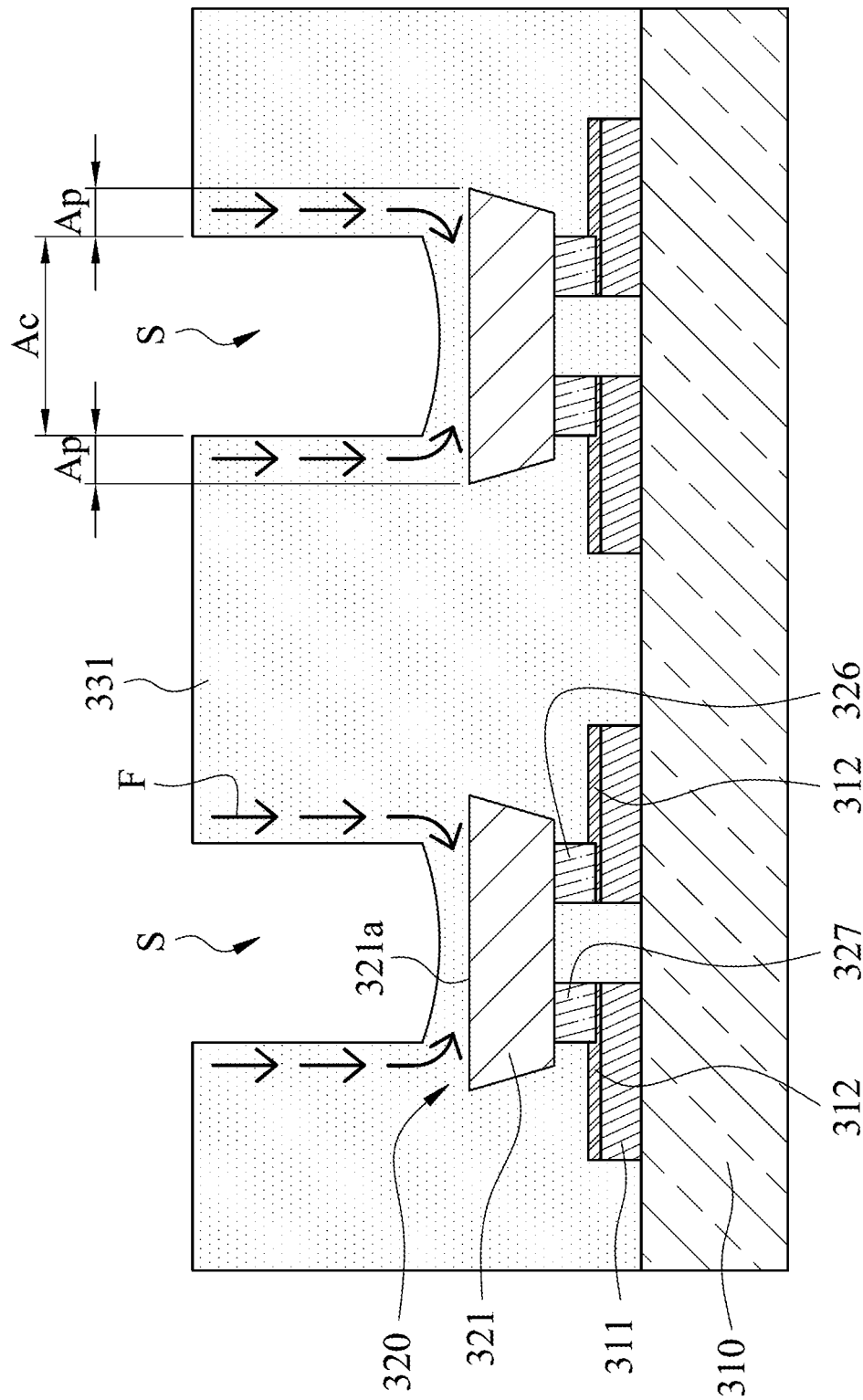
FIG. 13A is a schematic view of the removing step and a first transparent insulation area forming step according to the embodiment in FIG. 10.
Figure 13B:
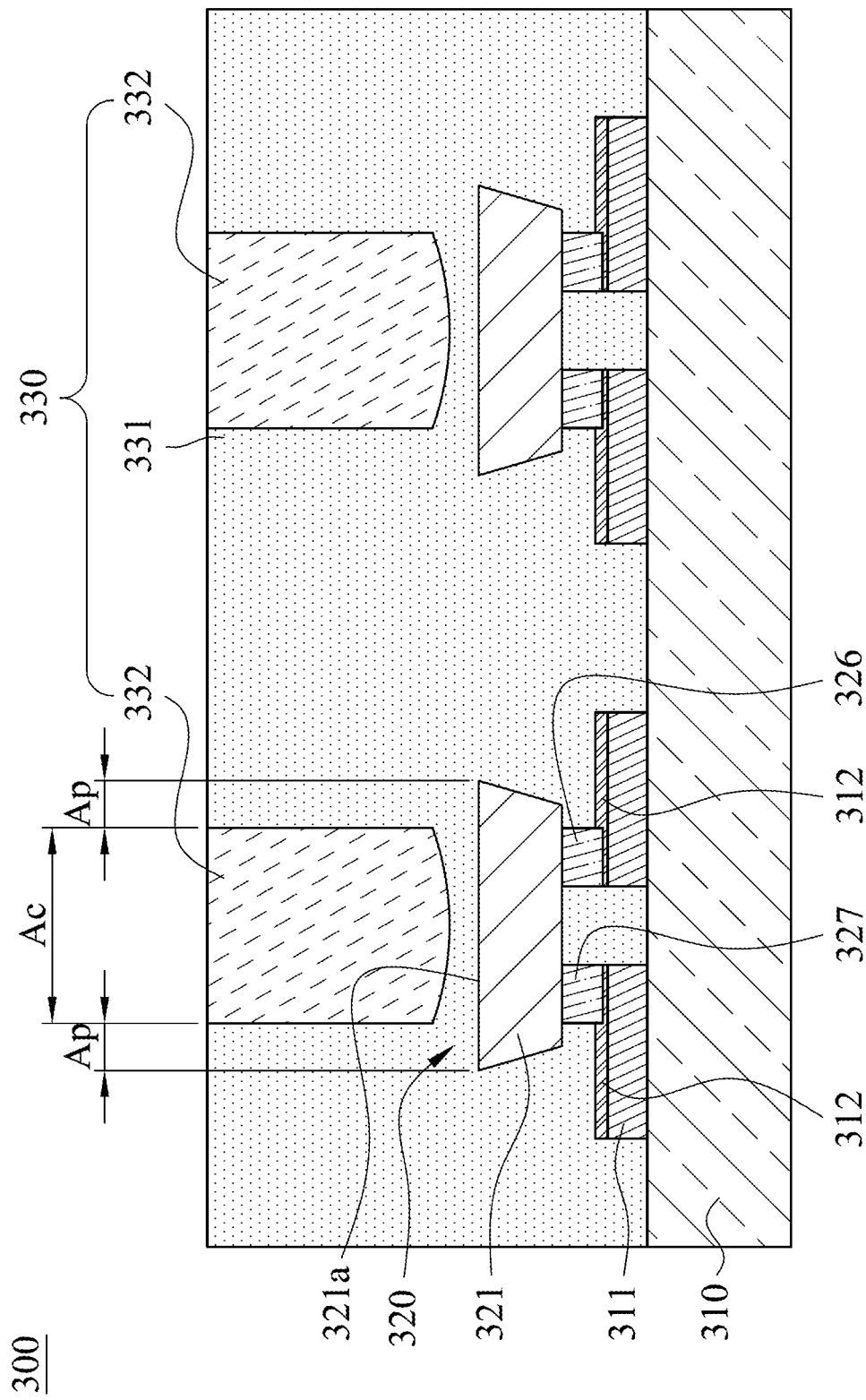
FIG. 13B is a schematic view of a second transparent insulation area forming step according to the embodiment in FIG. 10.

FIG. 13A is a schematic view of the removing step S303 and a first transparent insulation area forming step S305 according to the embodiment in FIG. 10. FIG. 13B is a schematic view of a second transparent insulation area forming step S306 according to the embodiment in FIG. 10. Further, in FIGS. 10, 13A and 13B, the curing step S304 can include the first transparent insulation area forming step S305 and the second transparent insulation area forming step S306. A time interval from the disposing step S302 to the curing step S304 is 10 seconds to 60 seconds. In particular, according to the embodiment of FIG. 13A, the time interval from the disposing step S302 to the first transparent insulation area forming step S305 is 10 seconds to 60 seconds.

In FIGS. 10 and 13A, the transposing unit C is removed from the transparent insulation layer 330 in the removing step S303, and the transparent insulation layer 330 is cured and covers the micro LED units 320 to form a plurality of first transparent insulation areas 331 and a plurality of disposing spaces S in the first transparent insulation area forming step S305.

In FIG. 13A, when the transposing unit C is removed from the transparent insulation layer 330, the transparent insulation layer 330 flows inwards in a flow direction F owing to the gravity after the transparent insulation layer 330 stood for a while. Then, the transparent insulation layer 330 covers the micro LED units 320.

According to FIG. 13B, in the second transparent insulation area forming step S306, a transparent insulation material (its reference numeral is omitted) is filled into the disposing spaces S and cured to form a plurality of second transparent insulation areas 332, wherein the first transparent insulation areas 331 and the second transparent insulation areas 332 cover the micro LED units 320.

In FIGS. 13A and 13B, the micro LED display device 300 includes the substrate 310, the micro LED units 320 and the transparent insulation layer 330. The substrate 310 includes the conductive pads 311 and the conductive connecting portions 312, wherein the conductive pads 311 are disposed on the substrate 310, and each of the conductive connecting portions 312 is correspondingly connected to one of the conductive pads 311. Each of the micro LED units 320 includes a semiconductor epitaxial structure 321 and two electrodes 326, 327, wherein the electrodes 326, 327 are disposed on the semiconductor epitaxial structure 321, and each of the electrodes 326, 327 is connected to one of the conductive connecting portions 312 which are adjacent to each other. The transparent insulation layer 330 is disposed on the substrate 310 and covers the conductive pads 311, the conductive connecting portions 312 and the micro LED units 320, and the transparent insulation layer 330 is filled between the electrodes 326, 327 of each of the micro LED units 320.

In detail, the transparent insulation layer 330 includes the first transparent insulation areas 331 and the second transparent insulation areas 332. The first transparent insulation areas 331 cover the substrate 310 and a portion of a surface 321a of each of the semiconductor epitaxial structures 321. The second transparent insulation areas 332 are connected to the first transparent insulation areas 331, and cover on the surface 321a of each of the semiconductor epitaxial structures 321.

Furthermore, the transparent insulation layer 330 relative to the surface 321a on each of the semiconductor epitaxial structures 321 is separated into a peripheral area Ap and a covering area Ac, and the peripheral area Ap covers a portion of the surface 321a on each of semiconductor epitaxial structures 321. According to the embodiment of FIG. 13B, the covering area Ac is covered by the first transparent insulation areas 331 and the second transparent insulation areas 332 of the transparent insulation layer 330, and the peripheral area Ap is only covered by the first transparent insulation areas 331.

Moreover, each of the first transparent insulation areas 331 can include a thermosetting resin material, and each of second transparent insulation areas 332 can include the thermosetting resin material or a quantum dot material. A material of each of the first transparent insulation areas 331 can be different from a material of each of the second transparent insulation areas 332, but the present disclosure is not limited thereto. Further, the quantum dot material can be similar to a color filter to convert the color of the light. For example, the micro LED unit 320 which is a blue sub-pixel can be converted to a red sub-pixel or a green sub-pixel by the quantum dot material, and the light converted by the quantum dot material is with high color purity.

Figure 14:
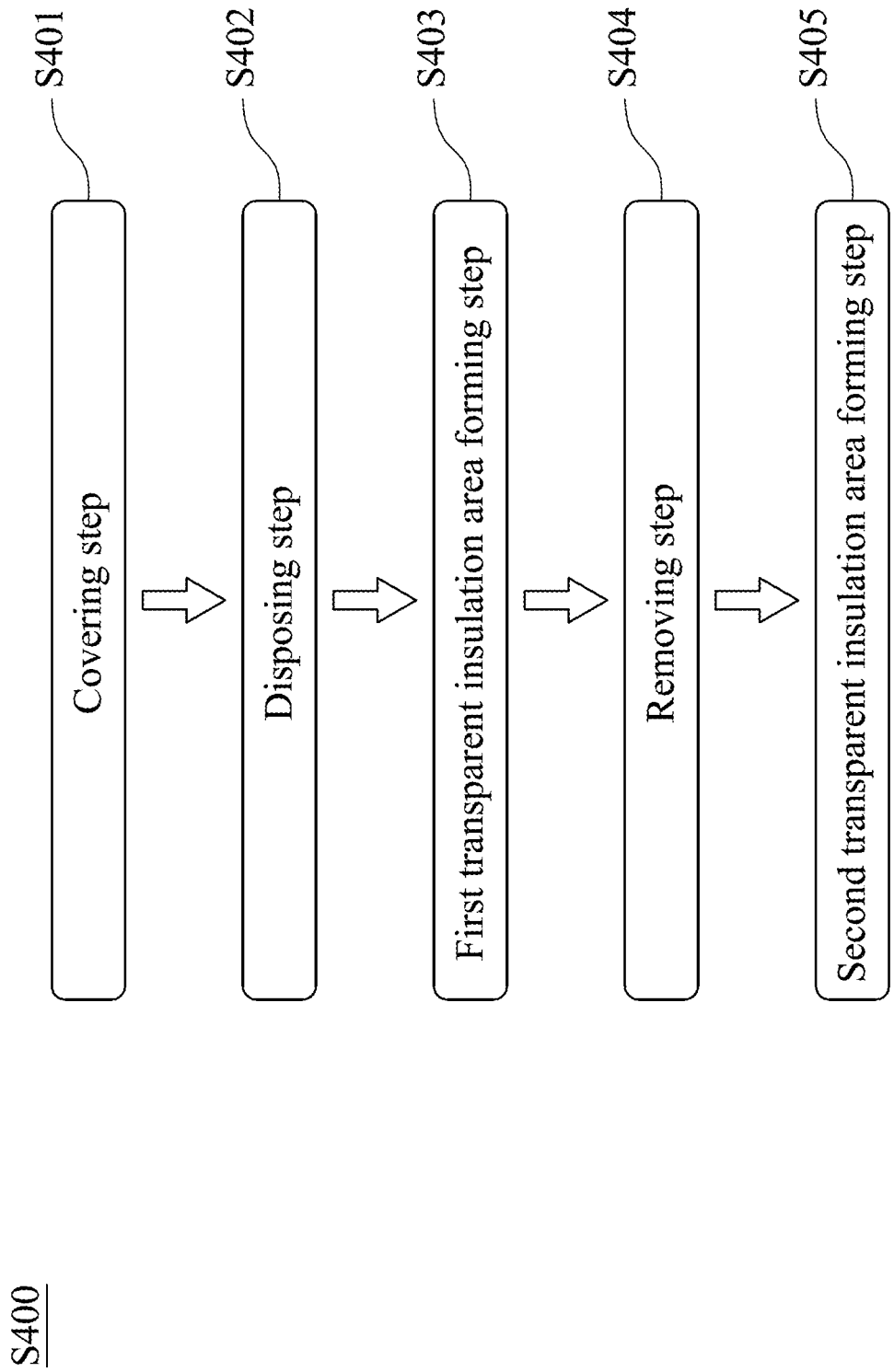
FIG. 14 is a step flow chart of a manufacturing method of a micro LED display device according to another embodiment of the present disclosure.

FIG. 14 is a step flow chart of a manufacturing method of a micro LED display device S400 according to another embodiment of the present disclosure. In FIG. 14, the manufacturing method of the micro LED display device S400 includes a covering step S401, a disposing step S402, a first transparent insulation area forming step S403, a removing step S404 and a second transparent insulation area forming step S405.

In detail, each of the covering step S401 and the disposing step S402 according to the embodiment of FIG. 14 can be referred to the embodiments of FIGS. 11 and 12. Because the covering step S401 and the disposing step S402 according to the embodiment of FIG. 14 are the same as the covering step S301 and the disposing step S302 according to the embodiment of FIG. 10, they will not be described again herein.

Figure 15A:
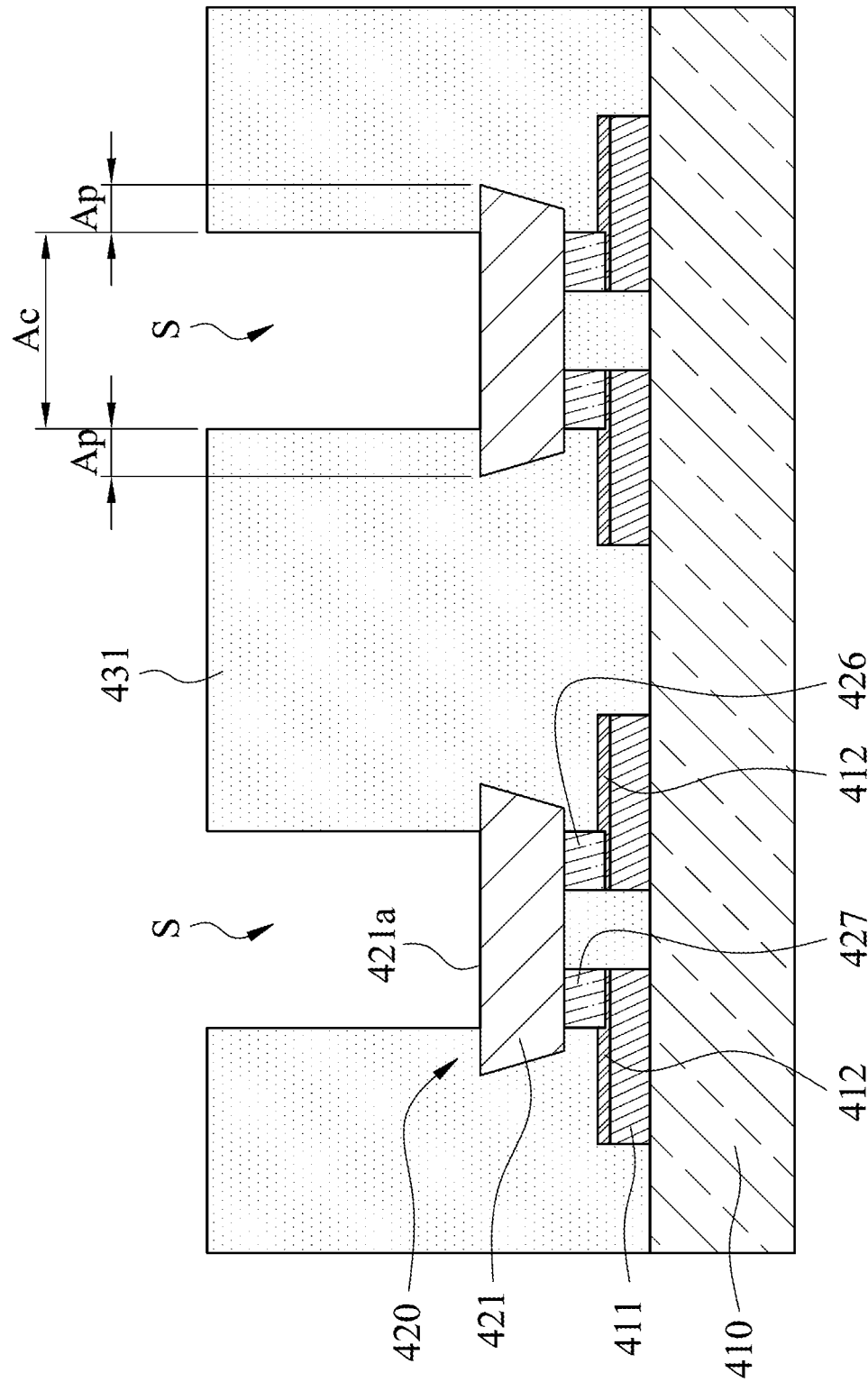
FIG. 15A is a schematic view of the first transparent insulation area forming step and the removing step according to the embodiment in FIG. 14.

FIG. 15A is a schematic view of the first transparent insulation area forming step S403 and the removing step S404 according to the embodiment in FIG. 14. In FIGS. 14 and 15A, a transparent insulation layer 430 (shown in FIG. 15B) is cured to form a plurality of first transparent insulation areas 431 and a plurality of disposing spaces S in the first transparent insulation area forming step S403, and the transposing unit (not shown) is removed from the transparent insulation layer 430 in the removing step S404. In particular, when micro LED units 420 are disposed on a substrate 410 by the transposing unit, the first transparent insulation area forming step S403 is performed to cure the transparent insulation layer 430 to form the first transparent insulation areas 431. Then, after curing the transparent insulation layer 430, the removing step S404 is performed to remove the transposing unit to form the disposing spaces S, thereby the disposing spaces S can be obtained without the exposing step, the developing step and the etching step, and a surface 421a as a portion of the top surface of each semiconductor epitaxial structure 421 is exposed. Further, the sequence of the removing step and the first transparent insulation area forming step can be altered on demand so as to flexibly form the disposing spaces S according to the embodiment to FIG. 13A or the disposing spaces S according to the embodiment to FIG. 15A.

Figure 15B:
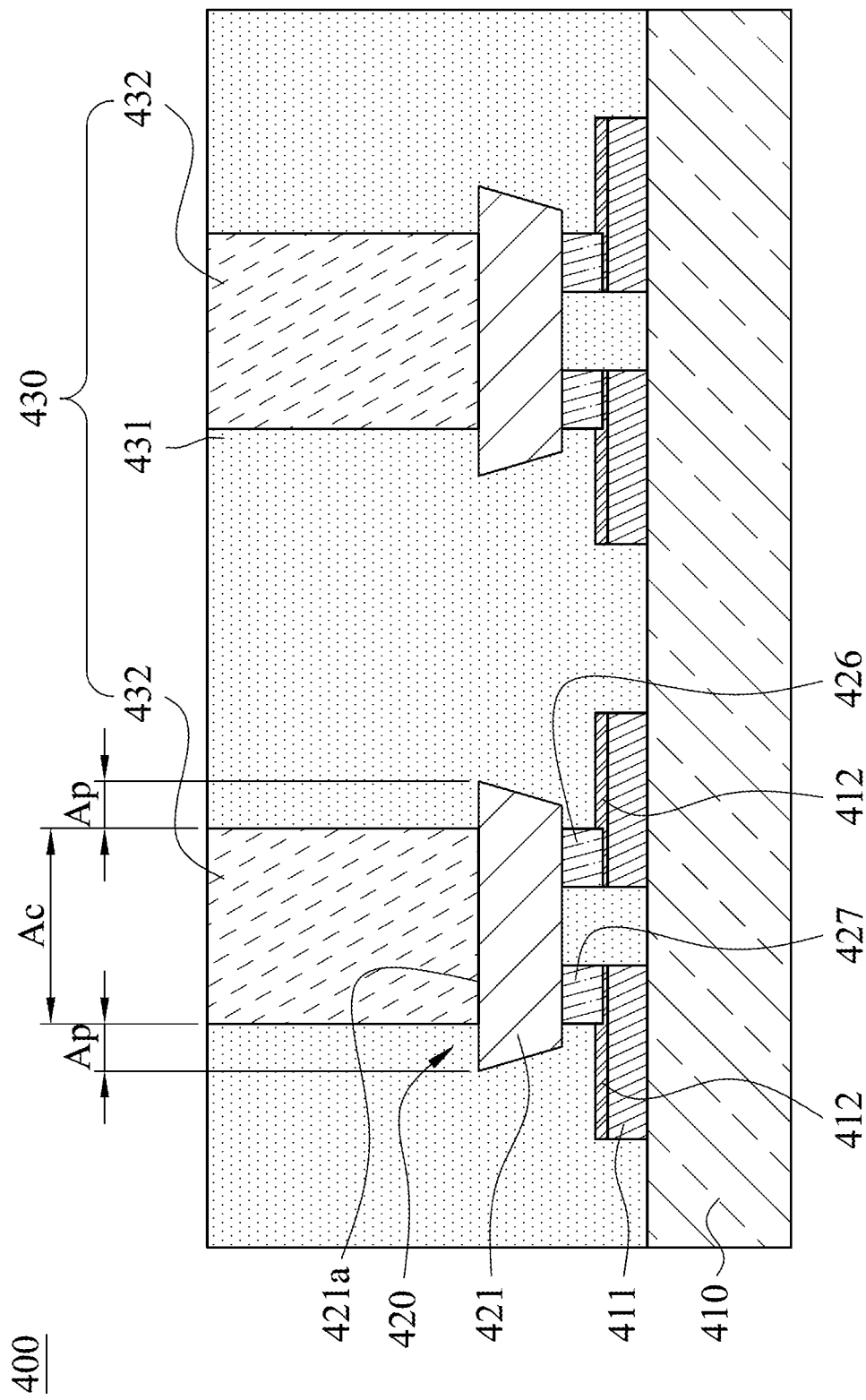
FIG. 15B is a schematic view of the second transparent insulation area forming step according to the embodiment in FIG. 14.

FIG. 15B is a schematic view of the second transparent insulation area forming step S405 according to the embodiment in FIG. 14. According to FIGS. 14 and 15B, in the second transparent insulation area forming step S405, a transparent insulation material (its reference numeral is omitted) is filled into the disposing spaces S and cured to form a plurality of second transparent insulation areas 432, wherein the first transparent insulation areas 431 and the second transparent insulation areas 432 (that is, the transparent insulation layer 430) cover the micro LED units 420.

Further, all of other structures and dispositions according to the embodiments of FIGS. 15A and 15B are the same as the structures and the dispositions according to the embodiments of FIGS. 13A and 13B, and will not be described again herein.

In FIGS. 15A and 15B, the micro LED display device 400 includes the substrate 410, the micro LED units 420 and the transparent insulation layer 430. The substrate 410 includes a plurality of conductive pads 411 and a plurality of conductive connecting portions 412, wherein the conductive pads 411 are disposed on the substrate 410, and each of the conductive connecting portions 412 is correspondingly connected to one of the conductive pads 411. Each of the micro LED units 420 includes the semiconductor epitaxial structure 421 and two electrodes 426, 427, wherein the electrodes 426, 427 are disposed on the semiconductor epitaxial structure 421, and each of the electrodes 426, 427 is connected to one of the conductive connecting portions 412 which are adjacent to each other. The transparent insulation layer 430 is disposed on the substrate 410 and covers the conductive pads 411, the conductive connecting portions 412 and the micro LED units 420, and the transparent insulation layer 430 is filled between the electrodes 426, 427 of each of the micro LED units 420. In detail, the transparent insulation layer 430 includes the first transparent insulation areas 431 and the second transparent insulation areas 432. The first transparent insulation areas 431 cover the substrate 410 and a portion of the surface 421a of each of the semiconductor epitaxial structures 421. The second transparent insulation areas 432 are connected to the first transparent insulation areas 431, and cover on the surface 421a of each of the semiconductor epitaxial structures 421.

Furthermore, the transparent insulation layer 430 relative to the surface 421a on each of the semiconductor epitaxial structures 421 is separated into a peripheral area Ap and a covering area Ac, and the peripheral area Ap covers the portion of the surface 421a on each of semiconductor epitaxial structures 421. According to the embodiment of FIG. 15B, the covering area Ac is covered by the second transparent insulation areas 432, and the peripheral area Ap is covered by the first transparent insulation areas 431. Further, all of other structures and dispositions according to the embodiment of FIG. 14 are the same as the structures and the dispositions according to the embodiments of FIGS. 5, 10, and will not be described again herein.

In summary, by the disposition of the transparent insulation layer, the short circuit owing to gap-free between the conductive connecting portions can be avoided, and the issue that the skew disposition of each of the micro LED units on the substrate can be solved, therefore the connection strength and the precision between the micro LED units and the substrate can be promoted, and further to increase the luminous efficiency of the micro LED units.

The foregoing description, for purpose of explanation, has been described with reference to specific examples. It is to be noted that Tables show different data of the different examples; however, the data of the different examples are obtained from experiments. The examples were chosen and described in order to best explain the principles of the disclosure and its practical applications, to thereby enable others skilled in the art to best utilize the disclosure and various examples with various modifications as are suited to the particular use contemplated. The examples depicted above and the appended drawings are exemplary and are not intended to be exhaustive or to limit the scope of the present disclosure to the precise forms disclosed. Many modifications and variations are possible in view of the above teachings.

What is claimed is:

1. A micro LED display device, comprising:
   a substrate, comprising:
      a plurality of conductive pads disposed on the substrate; and
      a plurality of conductive connecting portions, each of the conductive connecting portions correspondingly connected to one of the conductive pads;
   a plurality of micro LED units, each of the micro LED units comprising:
      a semiconductor epitaxial structure; and
      two electrodes disposed on the semiconductor epitaxial structure, and each of the two electrodes connected to one of the conductive connecting portions adjacent to each other; and
   a transparent insulation layer disposed on the substrate and covering the conductive pads, the conductive connecting portions and the micro LED units, and the transparent insulation layer filled between the two electrodes of each of the micro LED units;
   wherein the transparent insulation layer relative to a surface on each of the semiconductor epitaxial structures is separated into a peripheral area and a covering area, the peripheral area is of a first thickness, the covering area is of a second thickness, and the first thickness is larger than the second thickness.

2. The micro LED display device of claim 1, wherein the transparent insulation layer comprises a thermosetting resin material.

3. The micro LED display device of claim 1, wherein a surface of the transparent insulation layer is uneven.

4. The micro LED display device of claim 1, wherein each of the conductive connecting portions comprises a metal material or an anisotropic conductive adhesive material.

5. The micro LED display device of claim 1, wherein a thickness range of the transparent insulation layer is 10 micrometers to 50 micrometers.

6. The micro LED display device of claim 1, wherein the peripheral area covers a portion of the surface on each of the semiconductor epitaxial structures.

* * * * *